United States Patent [19]

Kissel

[11] Patent Number: 4,612,638
[45] Date of Patent: Sep. 16, 1986

[54] DIAGNOSTIC PROTECTION CIRCUIT AND METHOD USING TRI-STATE CONTROL AND POSITIVE FEEDBACK

[75] Inventor: William R. Kissel, Milford, Mich.

[73] Assignee: Chrysler Corporation, Highland Park, Mich.

[21] Appl. No.: 597,905

[22] Filed: Apr. 9, 1984

[51] Int. Cl.[4] .................... G06F 11/00; G01R 31/28
[52] U.S. Cl. .................................. 371/15; 324/73 R; 371/20
[58] Field of Search ............... 179/175.20 R, 175.21; 74/866, 731, 733, 752 A, 752 D, 861, 878; 318/490, 565, 596; 371/20, 25, 15; 324/73 R, 51, 73 AT, 415, 418, 62; 307/152; 361/86

[56] References Cited

U.S. PATENT DOCUMENTS

| 4,194,113 | 3/1980 | Fulks | 324/73 R |
| 4,300,085 | 11/1981 | Monma | 318/490 |
| 4,414,863 | 11/1983 | Heino | 74/866 |
| 4,449,058 | 5/1984 | Feldmann | 324/62 |
| 4,516,076 | 5/1985 | Pillari | 324/418 |

Primary Examiner—Michael R. Fleming
Attorney, Agent, or Firm—Mark P. Calcaterra

[57] ABSTRACT

A circuit and method, for use with an electronically controlled load network for diagnosing short-circuit and open-circuit conditions and for protecting loads affected by those conditions by using positive feedback in cooperation with a microprocessor controlled tri-state input/output port pin.

17 Claims, 5 Drawing Figures

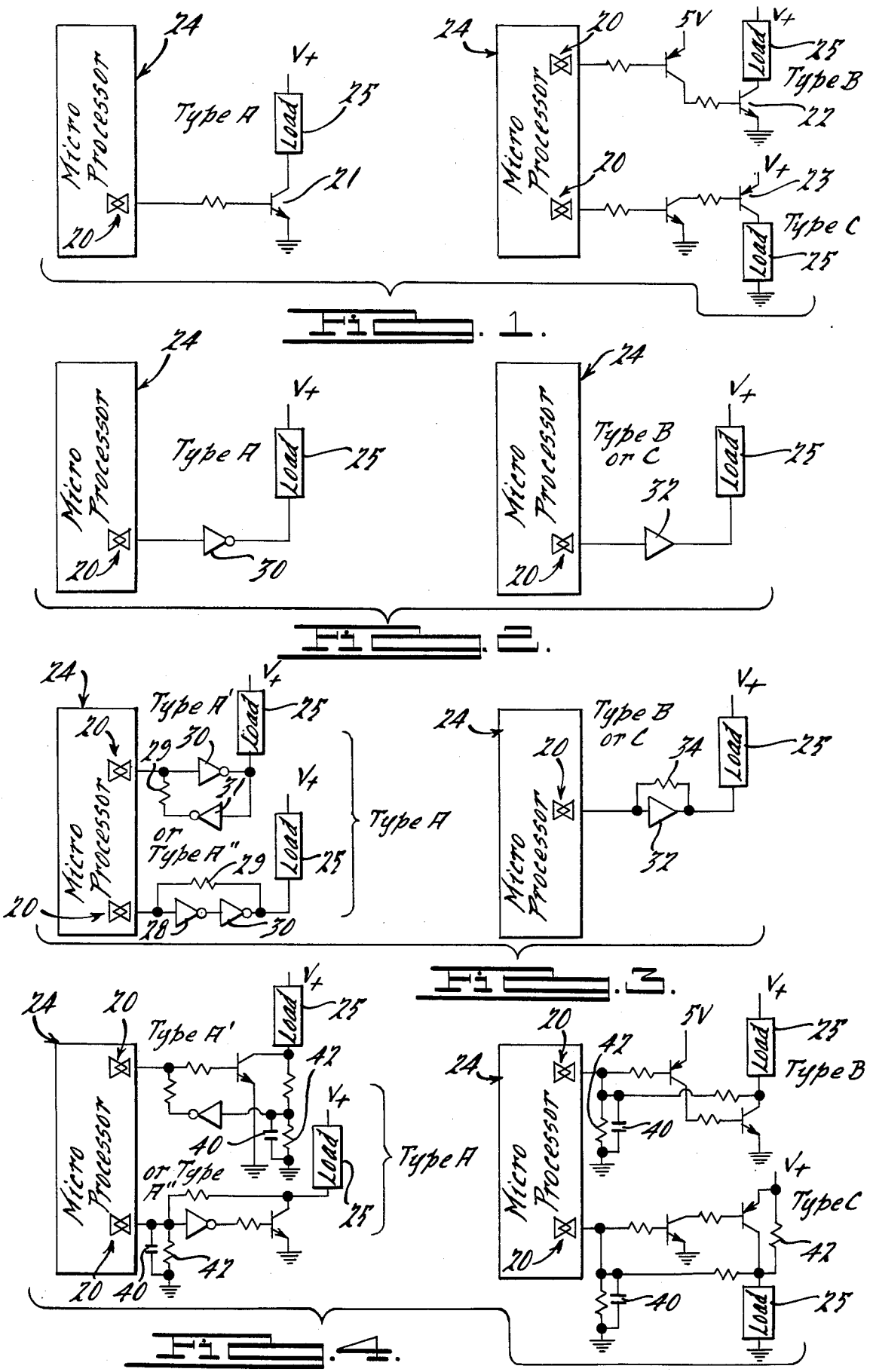

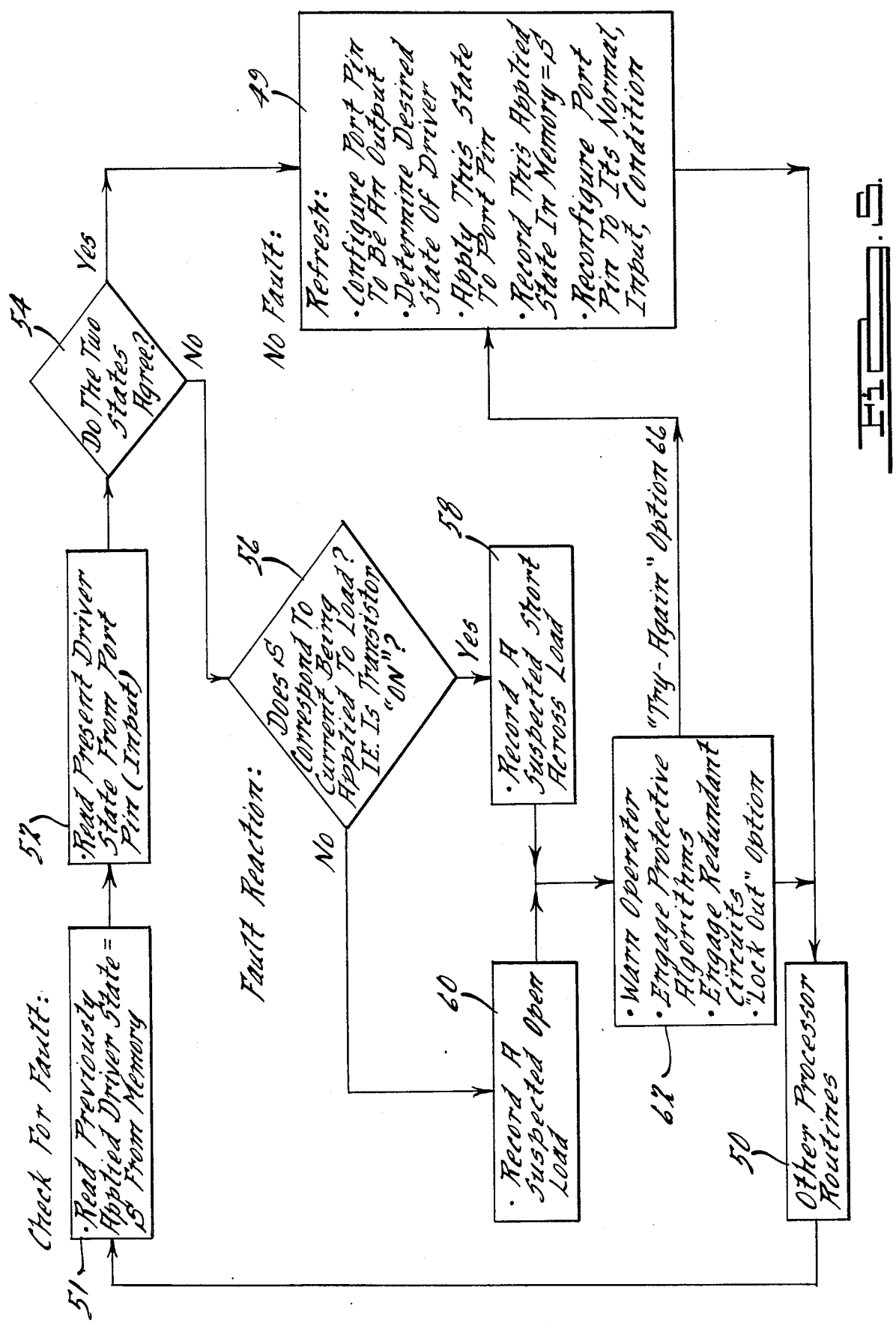

ically represented in terms of logic symbols for ease of description.

DIAGNOSTIC PROTECTION CIRCUIT AND METHOD USING TRI-STATE CONTROL AND POSITIVE FEEDBACK

BACKGROUND AND SUMMARY OF THE INVENTION

This disclosure relates to the sensing and reaction to open-circuits and shortcircuits. More specifically, the disclosure deals with a load network which is controlled by a central electronic controller or microprocessor. The circuit and method disclosed herein employs an input/output port from the electronic controller to send signals to the load network and to thereafter monitor the condition of the load network. The command signals are compared to the monitored condition; thereafter diagnostic and/or protection decisions can be implemented by the electronic controller.

In many complex automotive, information processing and robotic control systems, the outputs of a central electronic controller are connected to a network of motors, solenoids and other loads at various remote locations. The output devices within the controller are, obviously, vulnerable to damage by accidental shortcircuits or opencircuits due to a variety causes.

To protect output transistors against short-circuits and open-circuits, shutdown circuits are often added to the system which monitor output current through a sensing resistor. This method adds significant cost and complexity to the output circuit, and increases the minimum voltage at which the circuit will satisfactorily drive the load.

In these systems, it is often highly desirable to have some level of "self-diagnostics". While the actuation of a shut-down circuit is a good indication of a shortcircuit, open-circuits are also likely. The ability to sense an open-circuit ranges in importance depending upon the application. Open-circuit indication can be used merely to simplify repair or, it may be used to initiate the use of redundant system elements so that operation may continue. Or, it may be used to shut the system down.

Open-circuit detection is sometimes accomplished by a current monitoring circuit which also uses a current-sensing resistor. Or, it may involve voltage sensing at the load. Again, these techniques may add significant cost and complexity to the system and may degrade its operation.

The technique to be presented here is a way to protect load drivers against shorted loads, and to detect both shorted and open loads at extremely low costs.

DESCRIPTION OF THE DRAWINGS

Other objects, features and advantages of the present invention will become more fully apparent from the following detailed description of the preferred embodiment, the appended claims and the accompanying drawings in which:

FIG. 1 is a schematic representation of three typical controller/driver circuits, none of which has any protection or diagnostic capability.

FIG. 2 is a schematic showing the circuits of FIG. 1 in terms of logic symbols.

FIG. 3 shows the circuits of FIG. 2 with positive feedback added.

FIG. 4 shows some practical implementations of the schematic representations of FIG. 3.

FIG. 5 is a flow chart which will help to illustrate the method described herein.

DETAILED DESCRIPTION OF THE PREFERRED EMBODIMENT

This disclosure assumes the use of a tri-state input/output port pin, of the sort found on most modern microprocessors, or its equivalent. It is characteristic of a tri-state input/output pin that it can be configured to be either an "input" or an "output" at any particular time by the control of program.

When it is an "input", it is a high impedance to the outside world, and the voltage state applied to the pin is capable of being measured by the processor.

When it is an "output", the voltage state of the input/output pin is determined by the processor. The pin presents a low impedance to the outside world under this configuration.

This tri-state input/output pin is symbolically represented in all of the figures herein as two superimposed amplifier symbols, one representing the "input" configuration and the other representing the "output" configuration. In all of the figures, this symbol appears as 20.

Referring to FIG. 1, three different types of controller/driver circuits are illustrated as A, B and C. Each discloses some form of driving means in the form of transistors or amplifiers. The output transistors 21, 22 and 23 in FIG. 1 are obviously vulnerable to damage should the load become shorted. In each figure, each driver circuit is controlled by a microprocessor 24 with tri-state input/output pin 20. Each driver circuit drives a load 25. Supply voltages are indicated as V+ and 5 v.

It should also be observed that the controller's input/output pin 20 must remain in an "output" configuration to sustain conduction through the output transistor and the load. It should also be clear that the controller cannot verify conduction via this input/output pin 20 without it becoming an input and thereby losing conduction through the output transistor and load.

Even when the controller pin 20 is an "input" and might be capable of observing the state of the output transistor there are no means provided for it to receive this information.

Referring to FIG. 2, the controller/driver circuits of FIG. 1 are schematically represented in terms of logic symbols for ease of description.

The Type A driver is shown in FIG. 2 as an inverting amplifier 30, the input of which is connected to the input/output pin 20 and the output of which is connected to the load 25, the load being connected to the voltage supply V.

The Type B or Type C driver is shown in FIG. 2 as a non-inverting amplifier 32 connected just like the inverting amplifier 30 of Type A.

Adding to the schematic representations of FIG. 2 are a positive feedback features shown schematically in FIG. 3.

The Type A driver with positive feedback is shown in FIG. 3 in two alternative embodiments A' or A". Non-inverting amplifier 30 is shown in both embodiments as in FIG. 2.

The positive feedback for A' employs an inverting amplifier 31 in series with a feedback resistor 29 connected across the inverting amplifier 30.

The positive feedback for A" employs the inverting amplifier 28 in series with the inverting amplifier 30, and feedback resistor 29 in parallel with the amplifiers.

The Type B or Type C driver, schematically shown in FIG. 3, merely employs a feedback resistor 34 across the amplifier 32.

First, it should be observed that the controller input/output pin 20 may establish either output state by becoming an "output" with the appropriate logic level. The low impedance of the input/output pin 20 in this configuration can be expected to overcome the much higher impedance influence of the positive feedback.

The input/output pin may become an "input" once the state of the driver circuit is established. As long as the output voltage to the load is "correct", the positive feedback will maintain the output circuit in the established condition.

However, if the output voltage to the load is not correct, the positive feedback will cause the input of the driver circuit to change state as soon as the input/output pin 20 becomes an input.

Regarding the diagnostic benefits of the above-described circuit and method, it should be assumed that a state is established by a controller by a strobing action where the input/output pin 20 becomes an output for a short period of time. After the strobe, assume that the controller configures the input/output pin 20 as an input, and periodically checks the voltage state. If the state of the pin stays at the same logic level as that of the strobe pulse, the voltage output of the driver is "correct". If it changes, it is "incorrect".

A shorted load causes the driver output to be "incorrect" when the output transistor is "on". If proper bias is provided to overcome any incidental leakage currents, an open load causes the driver output to be "incorrect" when the output transistor is "off". In this way, the controller can identify the nature of the fault, and so indicate to the operator or service technician.

Regarding the protection benefits, assume that the load is shorted. Because the output driver is biased to assume an "off" state whenever the input/output pin 20 is an "input" and the "majority" of the available voltage is dropped across the driver rather than the load, the output transistor will be conducting into the short only during the strobing pulses. This "majority" is programmable by the design of the divider ratio in the feedback network. These pulses may be very brief, on the order of microseconds, and spaced at wide intervals, on the order of tens of milliseconds. Therefore, the duty cycle may be very low.

In practice, the current into the short will be limited by the gain into the transistor. While the instantaneous power may still be very high, the average will be, nonetheless, quite low and not damage the transistor. In this way, it is protected.

If additional protection is desired, the electronic controller may be programmed to cease operation of the driver circuit upon diagnosing a shorted load.

Referring to FIG. 4, some practical implementations of the abovedescribed circuit and method are shown.

Basically, the circuits in FIG. 4 impose the positive feedback schemes shown in FIG. 3 onto the circuits shown in FIG. 1.

In addition to the positive feedback means shown in FIG. 3, each practical implementation shown in FIG. 4 provides a capacitive network 40 to prevent the state of the driver (amplifier) from changing states by brief transients (a few microseconds) coming in on the output wire.

Also, in addition to the positive feedback means shown in FIG. 3, each practical implementation shown in FIG. 4 also provides a "driver-on" bias to the input/output pin 20 when the load 25 is in an "open" condition. This bias is just enough to overcome the leakage currents and logic bias currents. It provides a distinctive signal to the pin 20 that is only observed when the load 25 is in an "open" condition. Resistors labeled 42 in FIG. 4 perform this function.

Whereas the load 25, when in good condition, will draw current on the order of an ampere, the resistors 42 provide a current path on the order of a few microamps and have no substantial effect on the driving of the load.

If the V+ supply is greater than 5 volts, the positive feedback means should contain a voltage divder or some other means, to reduce the feedback voltage to a level acceptable for presentation to the microprocessor pin 20.

A typical flow chart is shown in FIG. 5 illustrating the steps and decision making process of the method described herein.

Referring to details in FIG. 5, the method can best be described by referring to the "no-fault" section of the blocked diagram beginning with block 49. Initially, the controller will configure the input/output port pin to be an "output". Next, the controller will determine the desired state that the driver of the particular network load is desired to be. The controller then applies this state to the appropriate port pin and records the supplied state in memory. For discussion here, this state will be labeled "S". The controller now reconfigures the input/output port pin to its normal "input" condition.

Sometime later in the routine, perhaps after other processor routines 50 in the controller's loop time, the controller will check for faults beginning with block 51. Initially, the controller will read the previously applied driver state S from memory. The controller will then proceed to block 52 and read the present driver state from the port pin, which was configured to be an input when leaving block 49 of the routine. Proceeding now to block 54, a comparison is made by the controller of the previously applied driver state S found in block 51 to the present driver state from the input/output port pin read from block 52. If the two states agree, then the condition is perceived as correct by the controller, and the routine, then, proceeds to the "no-fault" block 49 to either re-monitor the network loads or to refresh the previously described procedure based on the need to change the condition of one or more of the drivers.

Returning now to block 54, if the two states, as compared by the controller, do not agree, the routine then goes into a "fault reaction" mode begun in block 56. The routine then compares whether the driver state S corresponds to the current being applied to the load. That is, is the output transistor "on"? If the transistor is no, the routine proceeds to block 58 to record a suspected short across the load. Depending on the location of the short and the type of load and the conditions under which the system is currently operating will determine whether in block 62 the controller warns the operator of the system, engages protective algorithms, engages any redundant circuits, or shuts down the system with a lock-out option. Other processor routines 50 in the loop time can now be processed.

Also possible at this juncture, is the option to try the system again by branching through path 66.

Returning now to the fault reaction, block 56, if the output transistor is determined to be in an "off" state, the routine will proceed through block 60 to record a suspected open load and then continue in a manner similar to that previously described for suspected short loads down through blocks 62 and then through 66 depending on the nature of the network load.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. In systems controlled by electronic controllers which interface with a load network and a voltage supply, a diagnostic protection circuit for diagnosing short and open circuit conditions and for protecting the load network from damages due to the short and open circuit conditions comprising:
   a port pin in the electronic controller with the ability to be configured either as an input or as an output whereby the condition of the voltage at the port pin can be monitored by the electronic controller when the port pin is configured as an input and compared by the electronic controller to the voltage presented to the port pin by the electronic controller when the port pin was configured as an output;
   driver means with an input and an output for completing a circuit including the voltage supply and the load network, connected between the port pin and the load network; and
   positive feedback means connected between the load network and the port pin to reflect the condition of the load network from the output of the driver means back to the input of the driver means whereby the input to the driver means changes states under short and open circuit conditions.

2. The diagnostic protection circuit of claim 1 where the driver means comprises an amplifier and where the feedback means comprises a resistor.

3. The diagnostic protection circuit of claim 1 where the driver means comprises an inverter and where the feedback means comprises an inverter in series with a resistor.

4. The diagnostic protection circuit of claim 1 where the driver means comprises two series-connected inverters and the feedback means comprises a resistor.

5. The diagnostic protection circuit of claim 1 where the driver means comprises:
   a resistor; and
   a transistor, the emitter of which is connected to ground and the collector of which is connected to one side of the load network; the other side of the load network connected to the voltage supply;
   the resistor, connected between the port pin and the base of the transistor;
   and the positive feedback means comprises:
   a resistor divider network connected between the load network and ground; and
   an inverter, the input of which is connected to the midpoint of the resistor divider network;
   a capacitor connected between the midpoint of the resistor divider network and ground; and
   a resistor connected between the output of the inverter and the port pin.

6. The diagnostic protection circuit of claim 1 where the driver means comprises:
   an inverter, the input of which is connected to the port pin;
   a transistor, the collector of which is connected to one side of the load network and the emitter of which is connected to ground; the other side of the load network being connected to the voltage supply; and
   a resistor connected between the output of the inverter and the base of the transistor;
   and the positive feedback comprises:
   a resistor connected between the load network and the input to the inverter;
   a resistor and capacitor in parallel both connected between the input to the inverter and ground.

7. The diagnostic protection circuit of claim 1 where the driver means comprises:
   a first transistor, the collector of which is connected to one side of the load network and the emitter of which is connected to ground; the other side of the load is connected to the voltage supply;
   a second transistor, the emitter of which is connected to the voltage supply;
   a resistor connected between the collector of the second transistor and the base of the first transistor;
   a resistor connected between the port pin and the base of the second transistor;
   and the positive feedback means comprises:
   a resistor connected between the load network and the port; and
   a resistor and a capacitor in parallel connected between the port pin and ground.

8. The diagnostic protection circuit of claim 1 where the driver means comprises:
   a first transistor, the emitter of which is connected to the voltage supply and the collector of which is connected to the load network; the other side of the load network connected to the ground;
   a resistor connected between the voltage supply and the collector of the first transistor;
   a second transistor, the emitter of which is connected to ground;
   a resistor connected between the port pin and the base of the second transistor;
   a resistor connected between the collector of the second transistor and the base of the first transistor;
   and the positive feedback means comprises:
   a resistor connected between the load network and the port pin; and
   a resistor and a capacitor in parallel connected between the port pin and ground.

9. In systems employing a voltage supply and an electronic controller to control a load network of components external to the electronic controller;
   the electronic controller having a memory and a tri-state input-output port pin;
   the port pin exhibiting a high input impedance to components external to the electronic controller when the port pin is configued as a one-state input to monitor the state of the signal presented to the port pin and a low input impedance when the port pin is configured as a bistable output to provide a high or low state signal to the components external to the electronic controller;
   a method of diagnosing and protecting the load network comprising:
   operating the tri-state input/output port pin in an input preferred format so that the electronic controller is normally configured to monitor the state of the signal from components external to the electronic controller at the port pin and only changes to a bistable output configuration on a short duration interrupt basis to present the load network of components external to the electronic controller with a high or low signal;

providing positive feedback means from each load network back to the port pin so that the state of the load network will be reflected back to the port pin;

providing load driver means between the port pin and the load network;

configuring the load driver means so that the condition of the signal to the load network from the driver means when fed back to the port pin will further urge the driver means to maintain the same signal to the load network, latching the condition of the load network;

providing the impedance of the positive feedback means so that the impedance of the port pin, when configured as an output, overcomes the impedance of the positive feedback means thereby overcoming the latching effect of the positive feedback;

timing the configuring of the input/output port pin as an output so that it is only of sufficient duration to present an output signal to command that the driver means change its state and then revert back to an input;

storing the correct condition of each load network and presenting the correct condition to the driver means;

monitoring the actual condition of each load network;

comparing the monitored condition with the correct condition;

deciding whether to alarm, shut down, engage protective measures, engage redundant paths or try the output command again if the actual condition of the network is different than the correct condition.

10. The method of claim 9 further comprising:

driver means with an input and an output for completing a power circuit to the load network, connected between the port pin and the load network; and positive feedback means connected between the load network and the port pin to relfect the condition of the load from the output of the driver means back to the input of the driver means.

11. The method of claim 10 where the driver means comprises an amplifier and where the feedback means comprises a resistor.

12. The method of claim 10 where the driver means comprises an inverter and where the feedback means comprises an inverter in series with a resistor.

13. The method of claim 10 where the driver means comprises two seriesconnected inverters and the feedback means comprises a resistor.

14. The method of claim 10 where the driver means comprises:

a resistor; and a transistor, the emitter of which is connected to ground and the collector of which is connected to one side of the load network; the other side of the load network connected to the voltage supply;

the resistor, connected between the port pin and the base of the transistor;

and the positive feedback means comprises:

a resistor divider network connected between the load network and ground;

an inverter, the input of which is connected to the midpoint of the resistor divider network;

a capacitor connected between the midpoint of the resistor divider network and ground; and a resistor connected between the output of the inverter and the port pin.

15. The method of claim 10 where the driver means comprises:

an inverter, the input of which is connected to the port pin;

a transistor, the collector of which is connected to one side of the load network and the emitter of which is connected to ground; the other side of the load being connected to the voltage supply; and a resistor connected between the output of the inverter and the base of the transistor;

and the positive feedback comprises:

a resistor connected between the load and the input to the inverter;

a resistor and capacitor in parallel both connected between the input to the inverter and ground.

16. The method of claim 10 where the driver means comprises:

a first transistor, the collector of which is connected to one side of the load and the emitter of which is connected to ground; the other side of the load network is connected to the voltage supply;

a second transistor, the emitter of which is connected to the voltage supply;

a resistor connected between the collector of the second transistor and the base of the first transistor;

a resistor connected between the port pin and the base of the second transistor;

and the positive feedback means comprises:

a resistor connected between the load network and the port; and a resistor and a capacitor in parallel connected between the port pin and ground.

17. The method of claim 10 where the driver means comprises:

a first transistor, the emitter of which is connected to the voltage supply and the collector of which is connected to the load network; the other side of the load network connected to the ground;

a resistor connected between the voltage supply and the collector of the first transistor;

a second transistor, the emitter of which is connected to ground;

a resistor connected between the port pin and the base of the second transistor;

a resistor connected between the collector of the second transistor and the base of the first transistor;

and the positive feedback means comprises:

a resistor connected between the load network and the port pin; and a resistor and a capacitor in parallel connected between the port pin and ground.

* * * * *